(12) United States Patent
Komiya et al.

(10) Patent No.: US 6,800,132 B1
(45) Date of Patent: Oct. 5, 2004

(54) SILICON WAFER AND METHOD FOR MANUFACTURE THEREOF, AND METHOD FOR EVALUATION OF SILICON WAFER

(75) Inventors: Satoshi Komiya, Kanagawa (JP); Shiro Yoshino, Hiratsuka (JP); Masayoshi Danbata, Kanagawa (JP); Kouichirou Hayashida, Kanagawa (JP)

(73) Assignee: Komatsu Denshi Sinzoku Kabushiki, Kanagawa (JP)

( * ) Notice: Subject to any disclaimer, the term of this patent is extended or adjusted under 35 U.S.C. 154(b) by 0 days.

(21) Appl. No.: 10/049,875
(22) PCT Filed: Aug. 25, 2000
(86) PCT No.: PCT/JP00/05738
§ 371 (c)(1), (2), (4) Date: Feb. 12, 2002
(87) PCT Pub. No.: WO01/16409
PCT Pub. Date: Mar. 8, 2001

(30) Foreign Application Priority Data

Aug. 27, 1999 (JP) .......................................... 11-241186

(51) Int. Cl.$^7$ .............................................. C30B 15/14
(52) U.S. Cl. .............................. 117/13; 117/15; 117/17; 117/932; 423/345.1
(58) Field of Search .............................. 117/13, 17, 15, 117/932; 423/345.1

(56) References Cited

U.S. PATENT DOCUMENTS

| 5,935,320 A | 8/1999 | Graef et al. |
| 6,077,343 A | 6/2000 | Iida et al. .......................... 117/2 |
| 6,261,361 B1 | 7/2001 | Iida et al. ........................ 117/19 |

FOREIGN PATENT DOCUMENTS

| EP | 0 942 078 A1 | 9/1999 | ........... C30B/15/00 |
| EP | 0 962 556 A1 | 12/1999 | ........... C30B/15/00 |
| JP | 61193456 A | 8/1986 | |
| JP | 10098047 A | 4/1998 | |
| JP | 10208987 A | 8/1998 | |
| JP | 11135514 A | 5/1999 | |

OTHER PUBLICATIONS

Shimura et al.; "Nitrogen Effect on Oxygen Precipitation in Czochralski Silicon," *320 Applied Physics Letters*, vol. 48(3), Jan. 1986, New York, USA, 3 pgs. (XP–002105443).

Ciszek et al.; "Effect of Nitrogen Doping on Microdefects and Minority Charge Carrier Lifetime of High–Purity, Dislocation–Free and Multicrystalline Silicon," *Solar Energy Materials and Solar Cells*, vol. 41/42, 1996, pp. 61–70 (XP 000614222).

Chen et al.; "Performance and Reliability Assessment of Dual–Gate CMOS Devices With Gate Oxide Grown on Nitrogen Implanted Si Substrates," *Microelectronics Research Center, Department of Electrical Computer Engineering, The University of Texas, Austin, TX 78712*, Dec. 7, 1997, 4 pgs. (XP–000855877).

*Primary Examiner*—Robert Kunemund
(74) *Attorney, Agent, or Firm*—Welsh & Katz, Ltd.

(57) ABSTRACT

A method for producing a silicon ingot through pulling up a silicon single crystal according to the Czochralski method, wherein the silicon single crystal is pulled up while being doped with nitrogen in such a condition as to form a part having a nitrogen content of $5 \times 10^{13}$ atoms/cm$^3$ to $1 \times 10^{15}$ atoms/cm$^3$. A silicon wafer having a nitrogen content of $5 \times 10^{13}$ atoms/cm$^3$ to $1 \times 10^{15}$ atoms/cm$^3$ which is suitable for being treated with heat in a non-oxidizing atmosphere is manufactured of an ingot produced by using the method. The method can be used for producing a silicon wafer being doped with nitrogen and having satisfactory characteristics for use in a semiconductor device.

14 Claims, 14 Drawing Sheets

RELATIONSHIP BETWEEN ADDED NITROGEN CONCENTRATION AND OXIDE FILM WITHSTAND-VOLTAGE NON-DEFECTIVE RATIO AFTER HYDROGEN ANNEALING

RELATIONSHIP BETWEEN ADDED NITROGEN CONCENTRATION AND OXIDE FILM WITHSTAND-VOLTAGE NON-DEFECTIVE RATIO AFTER HYDROGEN ANNEALING

RELATIONSHIP BETWEEN ADDED NITROGEN CONCENTRAION AND OXIDE FILM WITHSTAND-VOLTAGE NON-DEFECTIVE RATIO AFTER REMOVAL BY POLISHING SURFACE LAYER OF 3 μm AFTER HYDROGEN ANNEALING

SILICON WAFER AND METHOD FOR MANUFACTURE THEREOF, AND METHOD FOR EVALUATION OF SILICON WAFER

TECHNICAL FIELD

The present invention relates to a method of manufacturing silicon wafers to be used in manufacturing semiconductor devices, suitable for non-oxidative heat treatment such as for example hydrogen atmosphere high-temperature heat treatment (called hydrogen heat treatment) etc.

BACKGROUND ART

Void defects etc that are agglomerated by vacancies and detected as for example LSTD, FPD or COP are present in silicon wafers (CZ-silicon wafers) manufactured by the Czochralski method (hereinbelow referred to as the CZ method). Since such crystal defects have an adverse effect on the quality of the final product, heat treatment such as hydrogen atmosphere high-temperature heat treatment (also called hydrogen heat treatment or hydrogen annealing) is often performed in order to remove such crystal defects. In fact it is known (Examined Japanese Patent Publications 3-80338) that in CZ-silicon wafers subjected to hydrogen treatment, void defects agglomerated by vacancies detected as LSTDs etc are eliminated, with the result that excellent oxide film voltage-withstanding properties are displayed.

However, since there is the problem that the benefit of hydrogen heat treatment is restricted exclusively to the extreme surface vicinity of the wafer, and noting the fact that the defect-eliminating benefit by the hydrogen heat treatment increases as the defect size becomes smaller, the method has been proposed (Unexamined Japanese Patent Publication No. 10-208987) of extending the benefit of the hydrogen heat treatment to deeper regions by speeding up the rate of cooling in the temperature zone where defects are generated during crystal growth so as to reduce the size of the defects to a very small size and performing hydrogen heat treatment thereon.

In addition, in order to make it possible to cope with increase in crystal diameter by this method, a method has also been proposed (Unexamined Japanese Patent Publication No. 10-260666) of achieving good wafer quality by optimizing V/G (where V is the pulling speed and G is the temperature gradient in the axial direction of the crystal in the vicinity of the melting-point), which governs the concentration of point defects (voids), which are thought to be the source of defects.

Recently, as another approach relating to reducing the size of defects, it is reported (Unexamined Japanese Patent Publication No. 10-98047) that wafers suitable for annealing can be manufactured by reducing the defect size by addition of nitrogen during growth of CZ silicon single crystals.

However, when nitrogen is added during crystallization from the melt, the nitrogen concentration changes in the length direction of the crystal due to segregation, so the problem arises that this tends to cause a nonuniform distribution of defects as a result.

Furthermore, although it is true that, when nitrogen is added, the benefit of high-temperature annealing can be more easily manifested, due to decrease in defect size. However, since the defect density increases on the other hand, under inadequate high-temperature annealing conditions, there is contrariwise a risk of causing deterioration of wafer quality.

To summarize, it has still not yet been fully verified whether or not wafers in which defect size has been reduced by addition of nitrogen (nitrogen doping) as described above are indeed suitable for use as products, and it has in fact not yet been clarified whether nitrogen-doped wafers can indeed be used as wafers for semiconductor device manufacture or not.

DISCLOSURE OF THE INVENTION

The present invention has been made in view of the foregoing problems, and an object of the present invention is, in a method of manufacturing a silicon wafer by doping with nitrogen, to verify manufacturing conditions such that a silicon wafer having satisfactory properties for use as a semiconductor device can be manufactured, and to enable manufacture of a nitrogen-doped wafer having excellent characteristics as a wafer for manufacturing a semiconductor device after performing heat treatment.

As a result of detailed study of growth conditions in view of the aforementioned problems, the inventors of the present application discovered manufacturing conditions for silicon wafers that have fully satisfactory performances for use in advanced semiconductor devices even after heat treatment, and thereby perfected the present invention.

More specifically, when the present inventors evaluated wafer performance through the measurement of gate oxide integrity of wafers doped with nitrogen (nitrogen-doped wafers), they discovered that, with this process, while nitrogen-doped wafers tended to show excellent results in a TZDB (time zero dielectric breakdown) test compared with wafers that had not been subjected to nitrogen doping after heat treatment under a non-oxidizing atmosphere, if the wafers were doped with nitrogen to a high concentration, the results of the TDDB (time dependent dielectric breakdown) test showed abnormalities.

Also, the present inventors discovered that, whereas whether the TZDB test results are good or not and whether abnormalities appear in the TDDB test results or not depend on the nitrogen concentration of the nitrogen-doped wafer, at the same time, the TZDB test results depend on the type of gas with which non-oxidative heat treatment is performed (for example whether this is hydrogen gas or argon gas), yet the nitrogen concentration for which abnormalities appear in the TDDB test results does not depend on the type of gas which is used to perform the non-oxidative heat treatment, but, rather, can be inferred to be practically fixed.

With these discoveries that made a great contribution to perfecting the present invention, the present inventors present for the first time in the present application the fact that nitrogen-doped wafers containing nitrogen of concentration not more than $4 \times 10^{14}$ atoms/cm$^3$, which is a concentration at which abnormalities appear in the TDDB test after heat treatment under non-oxidative atmosphere, are preferable as silicon wafers for non-oxidative heat treatment for semiconductor device manufacture. They therefore have taken this as the basic content of the claims of the present application.

Also, when nitrogen-doped wafers were evaluated in terms of the non-defective ratio with respect to gate oxide film voltage-withstand properties (GOI), the benefit of hydrogen heat treatment was fully displayed at the surface. In addition this benefit was independent of the amount of nitrogen doping. However, when an evaluation was conducted regarding a portion at a certain depth, the gate oxide film non-defective ratio was found to depend on nitrogen concentration and in fact there is an upper limit and a lower limit for the nitrogen doping amount. Thus it became clear that, when used as a product for a semiconductor device, the nitrogen concentration must be within a prescribed range. This discovery also contributed greatly to perfecting the present invention.

It should be noted that although the aforementioned Unexamined Japanese Patent Publication No. 10-98047 has the statement "a nitrogen concentration of at least $1\times10^{14}$ atoms/cm$^3$", no information in support of this is disclosed.

More specifically, according to the present invention, methods as indicated below and silicon wafers for non-oxidative heat treatment for semiconductor device manufacture are proposed.

A silicon wafer for non-oxidative heat treatment for semiconductor device manufacture wherein the nitrogen concentration is in the range from $5\times10^{13}$ atoms/cm$^3$ to $1\times10^{15}$ atoms/cm$^3$, preferably the range from $5\times10^{13}$ atoms/cm$^3$ to $8\times10^{14}$ atoms/cm$^3$, even more preferably $5\times10^{13}$ atoms/cm$^3$ to $4\times10^{14}$ atoms/cm$^3$ and further more preferably the range from $1\times10^{14}$ atoms/cm$^3$ to $4\times10^{14}$ atoms/cm$^3$.

Specifically, considering only the gate oxide film voltage-withstanding capability as found by TZDB, the range of nitrogen concentration for a good quality product corresponds to from $5\times10^{13}$ atoms/cm$^3$ to $1\times10^{15}$ atoms/cm$^3$ (within a range of gate oxide film withstand-voltage non-defective ratio of at least 90% as found by TZDB), preferably within a range of nitrogen concentration of $1\times10^{14}$ atoms/cm$^3$ to $8\times10^{14}$ atoms/cm$^3$ (within a range of gate oxide film withstand-voltage non-defective ratio of at least 95% as found by TZDB); if, in addition, the fixed current value TDDB is taken into consideration, this must be $4\times10^{14}$ atoms/cm$^3$ or less. The range for satisfactory products can therefore be divided into four, namely, a range of from $5\times10^{13}$ atoms/cm$^3$ to $1\times10^{15}$ atoms/cm$^3$; a range of $5\times10^{13}$ atoms/cm$^3$ to $8\times10^{14}$ atoms/cm$^3$; a range of from $5\times10^{13}$ atoms/cm$^3$ to $4\times10^{14}$ atoms/cm$^3$; and a range of from $1\times10^{14}$ atoms/cm$^3$ to $4\times10^{14}$ atoms/cm$^3$. These are suitably selected in accordance with the product to be manufactured.

It should be noted that the types of silicon wafer for heat treatment may include silicon wafers for hydrogen heat treatment supplied for heat treatment under a hydrogen atmosphere, silicon wafers for argon heat treatment supplied for heat treatment under an argon atmosphere, or silicon wafers for mixed gas supplied for heat treatment under a mixed gas atmosphere of hydrogen and argon; however, all non-oxidative heat treatments for reducing crystal defects of the wafer surface layer (annealing treatments under conditions in the absence of oxygen) are included in the scope of the present invention.

In a method of manufacturing a silicon ingot by pulling a silicon single crystal by the Czochralski method, a method of manufacturing a silicon ingot by pulling a silicon single crystal under conditions such as to form a portion of nitrogen concentration from $5\times10^{13}$ atoms/cm$^3$ to $4\times10^{14}$ atoms/cm$^3$ by doping of nitrogen. In particular, in a method of manufacturing a silicon ingot by pulling a silicon single crystal by the Czochralski method, a method of manufacturing a silicon ingot for manufacturing silicon wafers for non-oxidative heat treatment by pulling a silicon single crystal under conditions such as to form a portion of nitrogen concentration from $1\times10^{14}$ atoms/cm$^3$ to $4\times10^{14}$ atoms/cm$^3$ by doping of nitrogen.

In one embodiment of the present invention, a silicon wafer for heat treatment for semiconductor device manufacture as described above is manufactured by the Czochralski method (CZ method). In this case, a silicon ingot was manufactured by the Czochralski method by pulling a silicon single crystal while doping with nitrogen so as to provide a nitrogen concentration in a portion or the whole thereof of $5\times10^{13}$ to $1\times10^{15}$ atoms/cm$^3$. Then, a portion of nitrogen concentration in the range $5\times10^{13}$ to $1\times10^{15}$ atoms/cm$^3$, preferably $1\times10^{14}$ atoms/cm$^3$ to $8\times10^{14}$ atoms/cm$^3$ was cut from this silicon ingot and used for a silicon wafer for non-oxidative heat treatment for semiconductor device manufacture and in particular for a silicon wafer for hydrogen heat treatment or a silicon wafer for argon annealing. If the CZ method is employed, a system in which a magnetic field is applied to the melt (MCZ method) may also be adopted.

As the method of nitrogen doping, all methods that are currently known, such as the method of admixing nitrogen with the argon gas that is passed through the furnace when growing the crystal or the method of introducing nitrogen atoms into the pulled single crystal by dissolving silicon nitride in the raw-material melt and all methods that may in future be discovered can be employed.

Also, as embodiments of the present invention, the following may be cited.

A silicon wafer for semiconductor device manufacture manufactured by performing hydrogen heat treatment or argon annealing on a silicon wafer (silicon wafer for non-oxidative heat treatment as referred to above) for non-oxidative heat treatment for semiconductor device manufacture according to the present invention.

A silicon wafer for semiconductor device manufacture wherein the amount of nitrogen doping is adjusted taking into account the life of a virtual element.

A method of evaluating a nitrogen-doped wafer characterized in that a decision is made as to whether or not this nitrogen-doped wafer can be employed as a wafer for semiconductor device manufacture by calculating the life of a virtual element on the nitrogen-doped heat-treated wafer.

A method of evaluating a wafer as set out above characterized in that the method of calculating the life of a virtual element on the aforementioned wafer is a TDDB test.

By "virtual element" is meant a simulated element structure manufactured when performing a TDDB test or TZDB test; by "life of a virtual element" is meant the life of this simulated element structure.

BRIEF DESCRIPTION OF THE DRAWINGS

FIG. 3(A) is a view illustrating the measurement results of a constant-current TDDB test of a normal element in which nitrogen doping is not performed and FIG. 3(B) is a view illustrating the measurement results of a constant-current TDDB test of an element wherein no abnormalities were produced by performing nitrogen doping at high concentration;

FIG. 4(A) is a view showing the case where polishing was not performed, the case after 3 μm polishing, and the case after 6 μm polishing respectively superimposed; FIG. 4(B) is a view showing only data for the case of 3 μm polishing in particular, in order to facilitate understanding of the difference in comparison with FIG. 2, which shows the case of 3 μm polishing after performing hydrogen annealing;

FIG. 5(A) to FIG. 5(D) are views showing the results of a constant-current TDDB test in which, from a condition (FIG. 5(A)) in which no doping at all with nitrogen is performed, the nitrogen concentration was raised to $5 \times 10^{13}$ atoms/cm$^3$ (FIG. 5(B)), $1 \times 10^{14}$ atoms/cm$^3$ (FIG. 5(C)), and $1.13 \times 10^{14}$ atoms/cm$^3$ (FIG. 5(D));

FIG. 6(A) to FIG. 6(C) are views showing the results of a constant-current TDDB test in which the nitrogen concentration was raised to $1.64 \times 10^{14}$ atoms/cm$^3$ (FIG. 6(A)), $5.82 \times 10^{14}$ atoms/cm$^3$ (FIG. 6 (B)), and $1.37 \times 10^{15}$ atoms/cm$^3$ (FIG. 6(C)). FIG. 6(D) shows respectively hydrogen-annealed and argon-annealed wafers superimposed, doped with nitrogen at $5.82 \times 10^{14}$ atoms/cm$^3$ and at $1.37 \times 10^{15}$ atoms/cm$^3$;

BEST MODE FOR CARRYING OUT THE INVENTION

Figure 1:
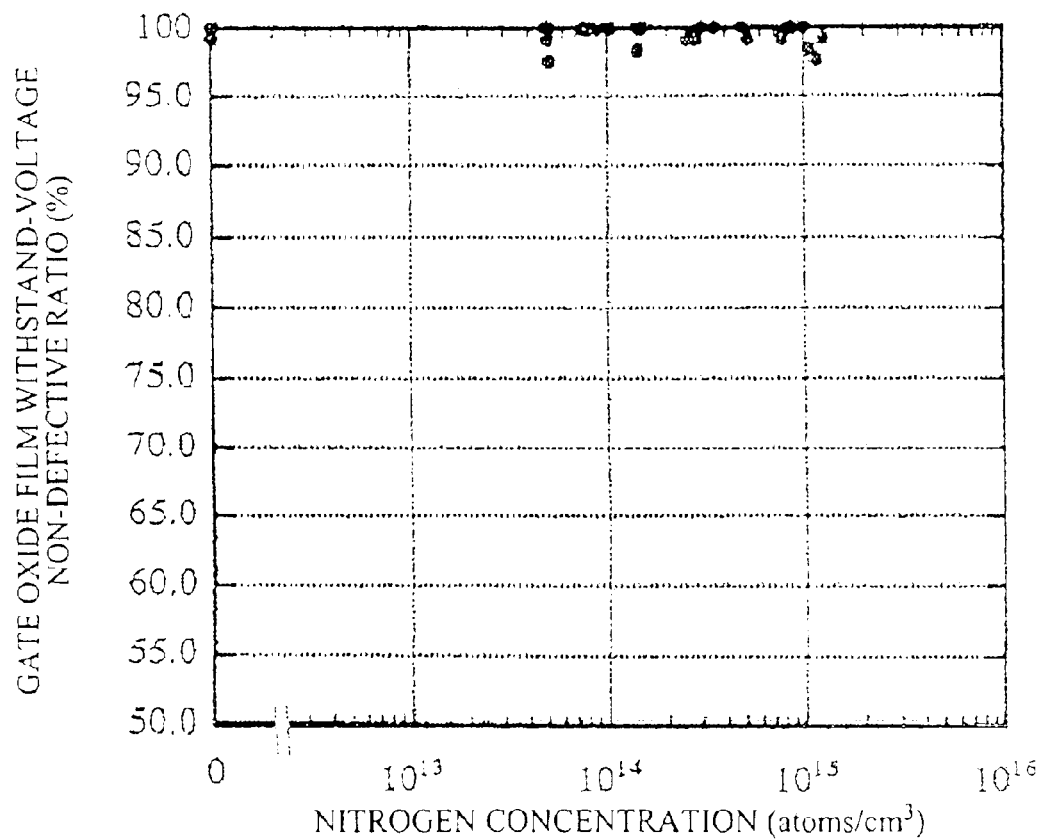
FIG. 1 is a graph illustrating the relationship between added nitrogen concentration and oxide film withstand-voltage non-defective ratio after hydrogen annealing.

As test examples, the present inventors cut silicon wafers from a CZ-silicon single crystal grown under various conditions and examined the effectiveness of defect elimination in the wafer depth direction by performance of hydrogen annealing after performing specular polishing process.

<Growing Single Crystals>

The crystals with boron added as dopant and diameter 200 mm, of p type and crystal orientation <100> were grown with the factors that control defect behavior, namely, V/G1 and V×G2 respectively in the ranges 0.13 to 0.4 mm$^2$/min° C. and 0.5 to 10° C./min (where V is the pulling speed, G1 is the temperature gradient in the vicinity of the solid/liquid interface, and G2 is the temperature gradient of the temperature zone of defect formation).

<Nitrogen Doping>

In growing such silicon single crystal ingots, nitrogen addition was performed such as to produce a nitrogen concentration of $4.9 \times 10^{13}$ atoms/cm$^3$ to $1.24 \times 10^{15}$ atoms/cm$^3$. Also, for comparison, crystals were prepared without nitrogen addition.

The nitrogen addition was performed by the method of introducing nitrogen gas into the CZ furnace or the method (Unexamined Japanese Patent Publication No.5-294780) of mixing with the raw-material silicon a wafer formed with a silicon nitride film on its surface.

<Quantitative Determination of Nitrogen Concentration>

For the quantitative determination of nitrogen concentration, quantitative determination was performed in respect of the portions capable of measurement using SIMS by measurement using SIMS, and, in respect of the portions incapable of measurement using SIMS, quantitative determination was performed from the portions measured using SIMS by calculation using a prescribed calculation formula.

More specifically, quantitative determination was performed on the extreme tail portion of the crystal straight cylindrical portion (solidification ratio about 90%) having a concentration of nitrogen sufficiently larger than the minimum value for detection in quantitative determination of nitrogen (up to $1 \times 10^{14}$ atoms/cm$^3$) using SIMS (manufactured by Cameca, model IMF-6F).

It was confirmed that there was no external disturbance to the measured values due to residual nitrogen gas from the atmosphere entering during sample changeover by using a silicon crystal grown by the FZ method, in which nitrogen was not introduced, as blank. Also, quantitative determination was performed with the nitrogen concentration calibrated by a known standard sample formed by ion implantation of nitrogen.

The nitrogen concentration in positions which could not be measured using SIMS was calculated using the following calculation formula.

$$Cs = kCo(1-L)^{k-1}$$

Where Cs is the impurity concentration in the crystal, Co is the initial impurity concentration in the melt, L is the solidification ratio and K is the segregation coefficient of nitrogen, taken to be 0.0007, from the reference: Yatsurugi et al (1973) J. Electrochem. Soc. 120. 975, which is well used in this field of industry.

In the above calculation formula, the concentration of nitrogen impurity in the molten silicon which is taken into the crystal is expressed using the segregation coefficient k which is characteristic of the impurity.

The formula given above is a formula which expresses the segregation phenomenon. Due to the segregation phenomenon, the impurity concentration (nitrogen concentration) increases with growth of the crystal, becoming a high concentration at the extreme tail portion of the crystal straight cylindrical portion, at which the minimum value for detection in quantitative determination of nitrogen by SIMS (up to $1 \times 10^{14}$ atoms/cm$^3$) is exceeded.

For the above reasons, in this practical example, it is arranged to measure the nitrogen concentration by SIMS at the extreme tail portion (solidification ratio about 90%) of the crystal straight cylindrical portion and the concentration at each crystal position is then calculated from the above formula using this value.

<Wafer Heat Treatment>

After doping with nitrogen ascribed above, hydrogen heat treatment (hydrogen annealing) and argon annealing were performed on a wafer that had been subjected to the quantitative determination process. Regarding the hydrogen annealing conditions and argon annealing, typically processing was performed at 1200° C.×1 hour and the gate oxide film withstand-voltage characteristic (GOI) was examined in a condition immediately after hydrogen heat treatment and immediately after argon annealing, respectively, in a condition in which 3 μm of the surface layer was removed after hydrogen treatment and a condition in which 3 μm of the surface layer was removed after argon annealing.

<Evaluation of Hydrogen Heat-treated (Hydrogen-annealed) Wafer>

[Gate Oxide Film Withstand-voltage (GOI)]

The gate oxide film withstand-voltage was measured by forming a MOS structure on a wafer and applying voltage thereto. When measuring the gate oxide film withstand-voltage after polishing to a depth of 3 μm, the wafer surface was polished to a depth of about 3 μm and the measurement was made by forming a MOS structure thereon and applying voltage thereto.

[TZDB (Time Zero Dielectric Breakdown) Test]

When measuring gate oxide film withstand-voltage by TZDB, in the case of the measurement method adopted in this test example, polysilicon electrodes of 10 mm$^2$ were used as gate electrodes and voltage was applied thereto by the step voltage application method. Also, the oxide film thickness was 25 nm. Furthermore, the measurement temperature was room temperature (25° C.), and the withstand-voltage evaluation current was 10 μA.

As a result, as shown in FIG. 1, the oxide film withstand-voltage non-defective ratio immediately after hydrogen treatment was practically 100%, irrespective of nitrogen concentration and growth conditions.

Figure 2:
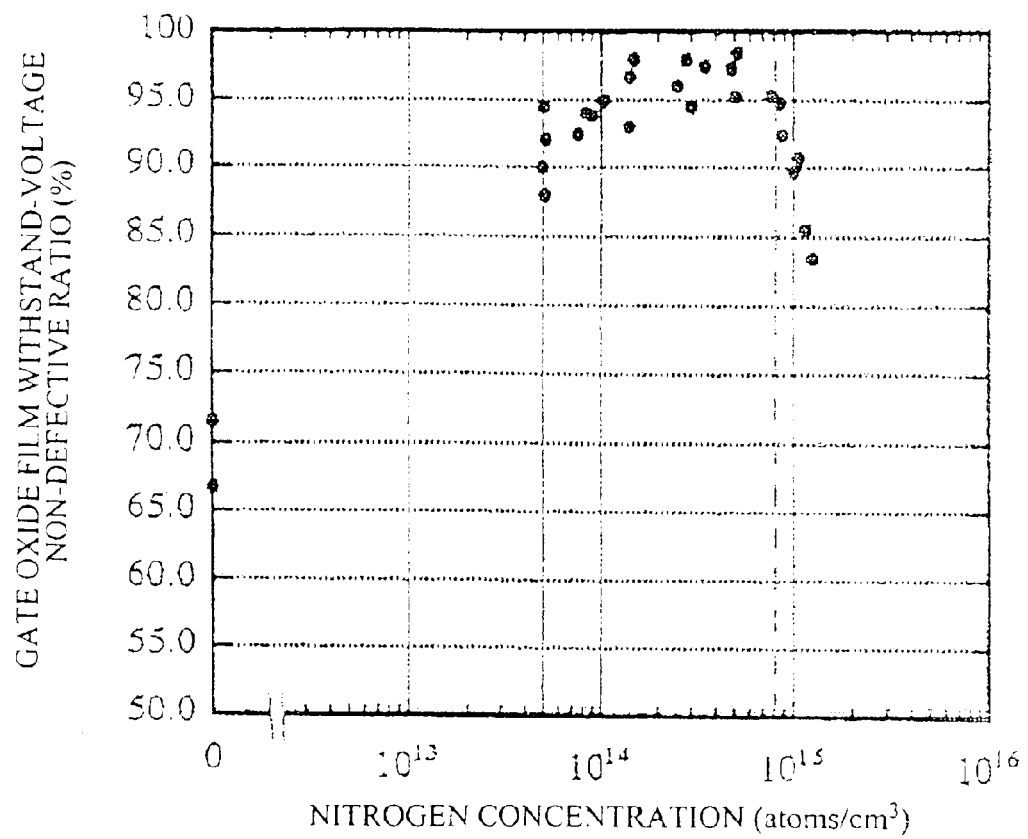
FIG. 2 is a graph illustrating the relationship between added nitrogen concentration and oxide film withstand-voltage non-defective ratio after removal of a 3 µm surface layer by polishing after hydrogen annealing.

However, when, after hydrogen treatment, the surface layer of 3 μm was removed and the oxide film withstand-voltage ascertained, as shown in FIG. 2, it was found that, although non-defective ratio increased with increase in nitrogen concentration up to 6×10$^{14}$ atoms/cm$^3$, above this, the non-defective ratio actually fell.

Taking into consideration integrity of the wafer surface layer (device active layer), whose importance increases as the integration degree of device becomes higher, it is necessary to maintain an oxide film withstand-voltage non-defective ratio as far as a depth of 3 μm from the surface layer of at least 90%.

From FIG. 2 it can therefore be seen that in order to achieve an oxide film withstand-voltage non-defective ratio of 90% or more it is necessary that the nitrogen concentration should be in the range 5×10$^{13}$ to 1×10$^{15}$ atoms/cm$^3$; and, in order to achieve an oxide film withstand-voltage non-defective ratio of 95% or more, which is even more preferable for the product, it can be seen that it is necessary to set the nitrogen concentration in the range 1×10$^{14}$ to 8×10$^{14}$ atoms/cm$^3$.

[Constant-current TDDB (Time Dependent Dielectric Breakdown) Test]

For the constant-current TDDB, breakdown of the oxide film after lapse of a prescribed time with the current kept constant is ascertained by change of the voltage applied to the element. For measurement, a MOS structure is formed in the same way as in the case of inspection of the oxide film withstand-voltage.

In the measurement, with the method of measurement adopted in this test example, polysilicon electrodes of 1 mm$^2$ were used as the electrodes. Also, the oxide film thickness was 25 nm. Furthermore, the measurement temperature was 125° C., the applied current density was 50 mA/cm$^2$, and the evaluating electrical field was 4 MV/cm.

When the constant-current TDDB was measured, it was found that, in the case of a normal element, instantaneous breakdown occurred on exceeding about 100 seconds. However, in the case of an abnormal element, instantaneous breakdown did not occur but rather breakdown occurred over time, so breakdown proceeded progressively, starting from before the lapse of 100 seconds. Consequently, the result is that breakdown is observed to have occurred after lapse of 100 seconds, depending on the value to which the evaluating electrical field is set. Consequently, if the measurement results of constant-current TDDB are graphed, in the case of normal elements, the results are concentrated on the plot at a location after lapse of a fixed time (in this case, about 100 seconds) and points on the plot do not appear elsewhere (see FIG. 3(A)); however, in the case of abnormal elements, points on the plot do appear elsewhere at locations remote from a lapsed time of 100 seconds (see FIG. 3(B)).

Figures 3A, 3B:
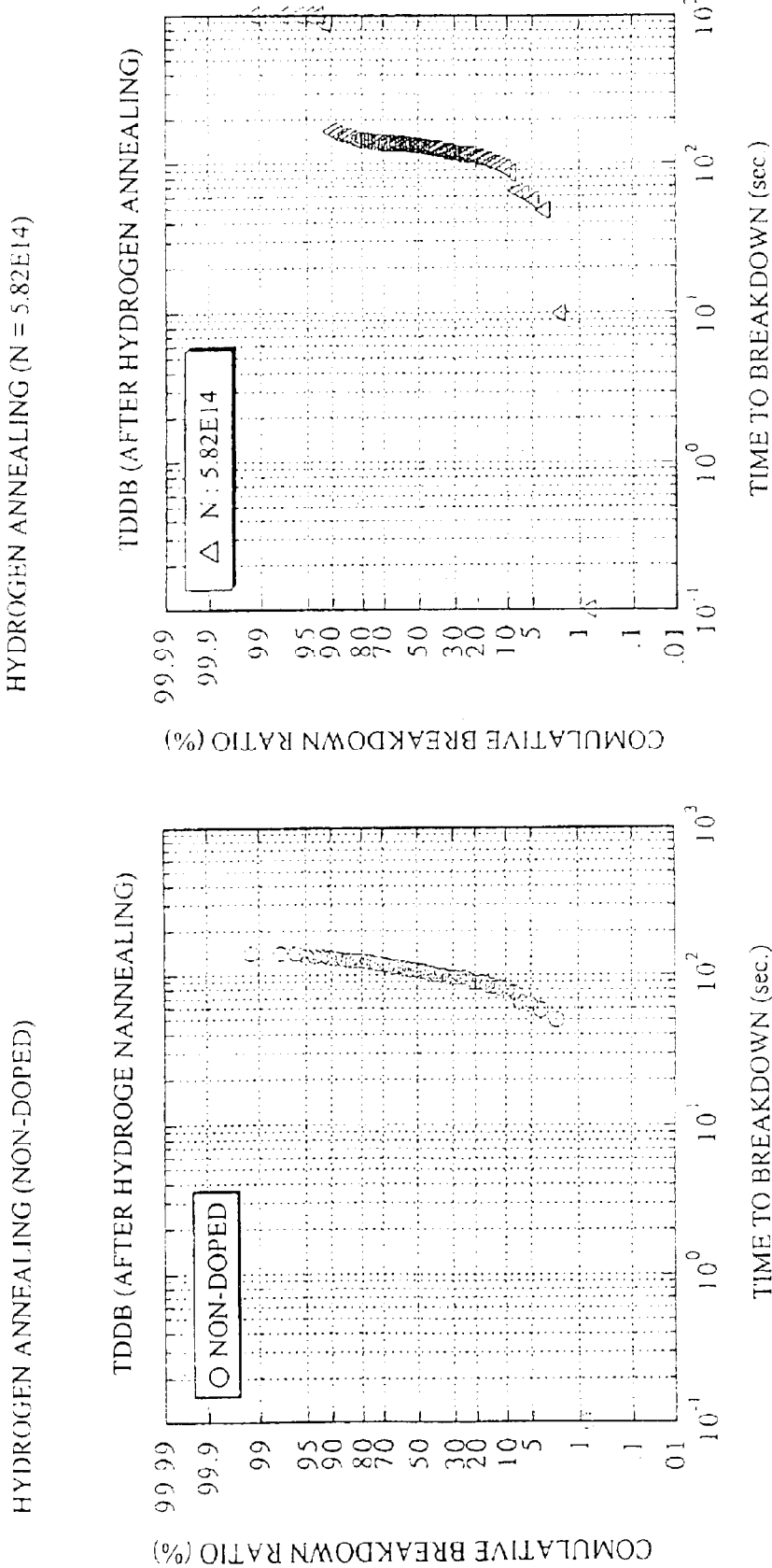
FIGS. 3(A) and 3(B) are views illustrating the measurement results of a silicon wafer constant-current TDDB test after hydrogen heat treatment.

Occurrence of such abnormalities in heat-treated wafers is not observed in wafers that have been heat-treated with no nitrogen doping (FIG. 3(A)), but is a characteristic phenomenon occurring in respect of heat-treated wafers that have been doped with nitrogen to a high concentration.

The TDDB test is one type of reliability test of semiconductor devices and provides an index of the constancy of the ability to withstand element fatigue. The TDDB test can also be utilized to provide simulated data for inferring stability of the life of semiconductor devices manufactured from the wafers used in the test.

In this test example, the constant-current TDDB in a condition in which no polishing was performed and the constant-current TDDB after polishing to a depth of 3 μm were measured for various wafers after hydrogen heat treatment.

As a result, the data shown in the tables below were obtained.

TABLE 1

| Nitrogen concentration (atoms/cm$^3$) | Item evaluated TDDB abnormality ratio % |
| --- | --- |
| 0 | 0 |
| 0 | 0 |
| 0 | 0 |
| 0 | 0 |
| 5.00E + 13 | 0 |
| 5.10E + 13 | 0 |
| 6.30E + 13 | 0 |
| 1.13E + 14 | 0 |
| 1.41E + 14 | 0 |
| 1.51E + 14 | 0 |
| 1.64E + 14 | 0 |
| 4.97E + 14 | 21.6 |
| 5.82E + 14 | 7.35 |
| 6.48E + 14 | 29.7 |
| 1.26E + 15 | 5.41 |
| 1.37E + 15 | 8.82 |

TABLE 2

| Nitrogen concentration (atoms/cm$^3$) | Item evaluated TDDB abnormality ratio % |
| --- | --- |
| 0 | 0 |
| 0 | 0 |
| 0 | 0 |
| 0 | 0 |
| 5.00E + 13 | 0 |
| 5.10E + 13 | 0 |
| 6.30E + 13 | 0 |
| 1.13E + 14 | 0 |
| 1.41E + 14 | 0 |
| 1.51E + 14 | 0 |
| 1.64E + 14 | 0 |
| 4.97E + 14 | 18.9 |
| 6.48E + 14 | 8.11 |
| 8.61E + 14 | 13.5 |
| 1.12E + 15 | 10.8 |
| 1.26E + 15 | 8.11 |

Table 1 shows the relationship between the nitrogen concentration in the condition in which no polishing is performed and the constant-current TDDB abnormality ratio; Table 2 shows the relationship between the nitrogen concentration after polishing to 3 μm and the constant-current TDDB abnormality ratio. As shown in these tables, normal values of the constant-current TDDB are shown when the nitrogen concentration is 4×10$^{14}$ atoms/cm$^3$ or less. Consequently, by adding this requirement to the aforementioned oxide film withstand-voltage conditions, the optimum conditions for a nitrogen-doped crystal become such as to provide a silicon wafer for heat treatment wherein the nitrogen concentration is in a range from $5 \times 10^{13}$ atoms/cm$^3$ to $4 \times 10^{14}$ atoms/cm$^3$, in particular, a silicon wafer for heat treatment wherein the nitrogen concentration is in a range from $1 \times 10^{14}$ atoms/cm$^3$ to $4 \times 10^{14}$ atoms/cm$^3$.

<Evaluation of Argon-annealed Wafer>

[TZDB (Time Zero Dielectric Breakdown) Test]

Figures 4A, 4B:
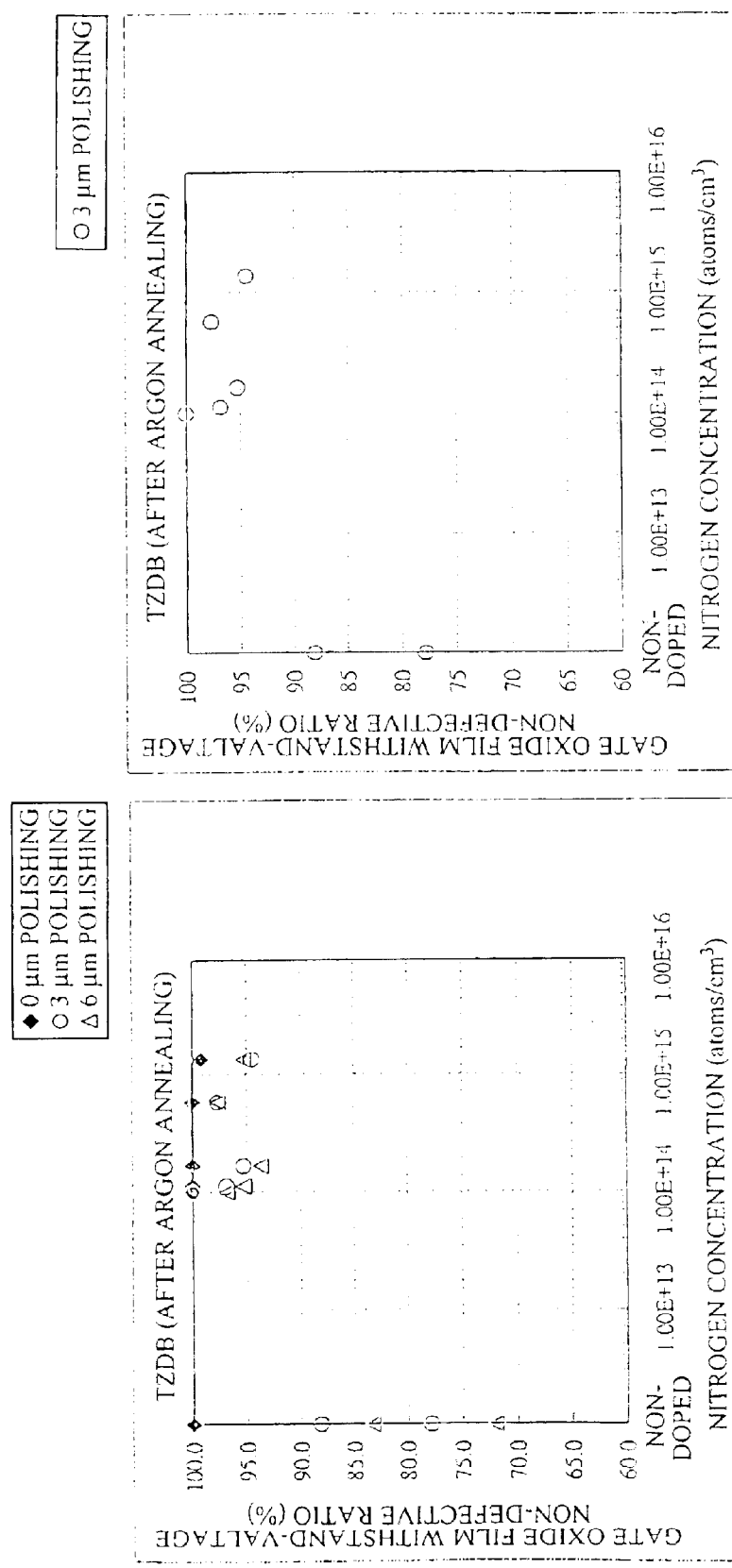
FIGS. 4(A) and 4(B) are views showing the results of measurement of the gate oxide film withstand-voltage (GOI) obtained by a TZDB test of an argon-annealed nitrogen-doped wafer. In FIG. 4.

Measurement of the gate oxide film withstand-voltage (GOI) using the TZDB test was conducted under the same conditions as in the case of hydrogen annealing. However, in the case of argon annealing, the gate oxide film withstand-voltage was also measured after polishing to 6 μm. The results are shown in FIG. 4. It should be noted that, whereas, in this FIG. 4, FIG. 4(A) shows the case where polishing was not performed, the case where polishing to 3 μm was performed and the case where polishing to 6 μm was performed, respectively superimposed, in FIG. 4(B), in order to facilitate understanding of the difference from FIG. 2, which shows the case where polishing to 3 μm was performed after hydrogen annealing, in particular only data for the case of polishing to 3 μm are shown.

As can be seen from this FIG. 4, wafers that have been subjected to nitrogen doping have excellent gate oxide film withstand-voltage characteristics in the TZDB test, compared with wafers that have not been subjected to nitrogen doping; also, no clear upper limit is observed as it is in the case of wafers polished to a depth of 3 μm after hydrogen annealing. Consequently, in the case of argon-annealed wafers that have been subjected to nitrogen doping either nothing like an upper limit in regard to nitrogen concentration is found in the TZDB test, or an upper limit is found at a location appreciably higher than the nitrogen concentration of $1 \times 10^{15}$ atoms/cm$^3$, which is the upper limit in the case of hydrogen annealing. Furthermore, as can be seen from FIG. 4(A), there is not much difference in the results of the TZDB test for argon-annealed wafers both in the case of wafers that were polished to a depth of 3 μm and wafers that were polished to a depth of 6 μm.

[Constant-current TDDB (Time Dependent Dielectric Breakdown) Test]

The constant-current TDDB test also, like the TZDB test, was conducted under the same conditions as in the case of hydrogen annealing. The results are shown in FIG. 5 to FIG. 7.

Figure 5A:
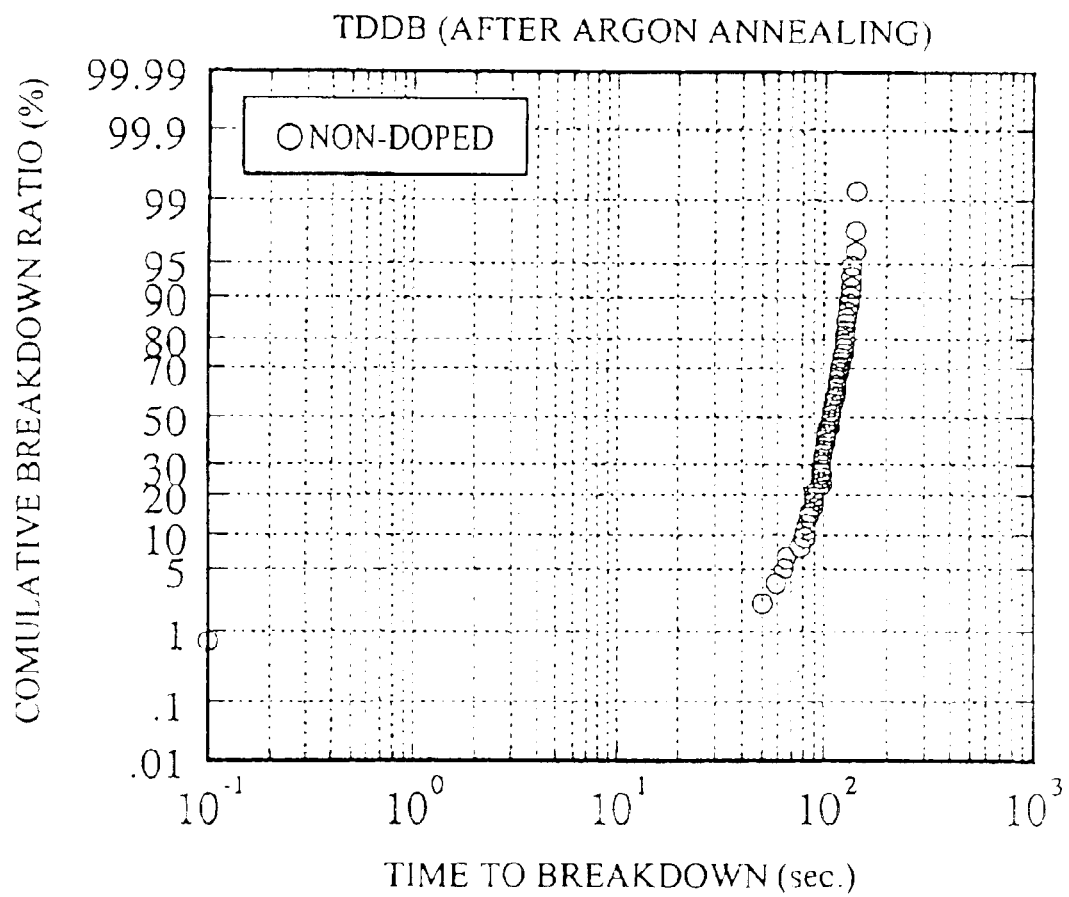
FIGS. 5(A) through 5(D) are views showing the results of a constant-current TDDB test of an argon-annealed nitrogen-doped wafer. In particular.
Figure 5B:
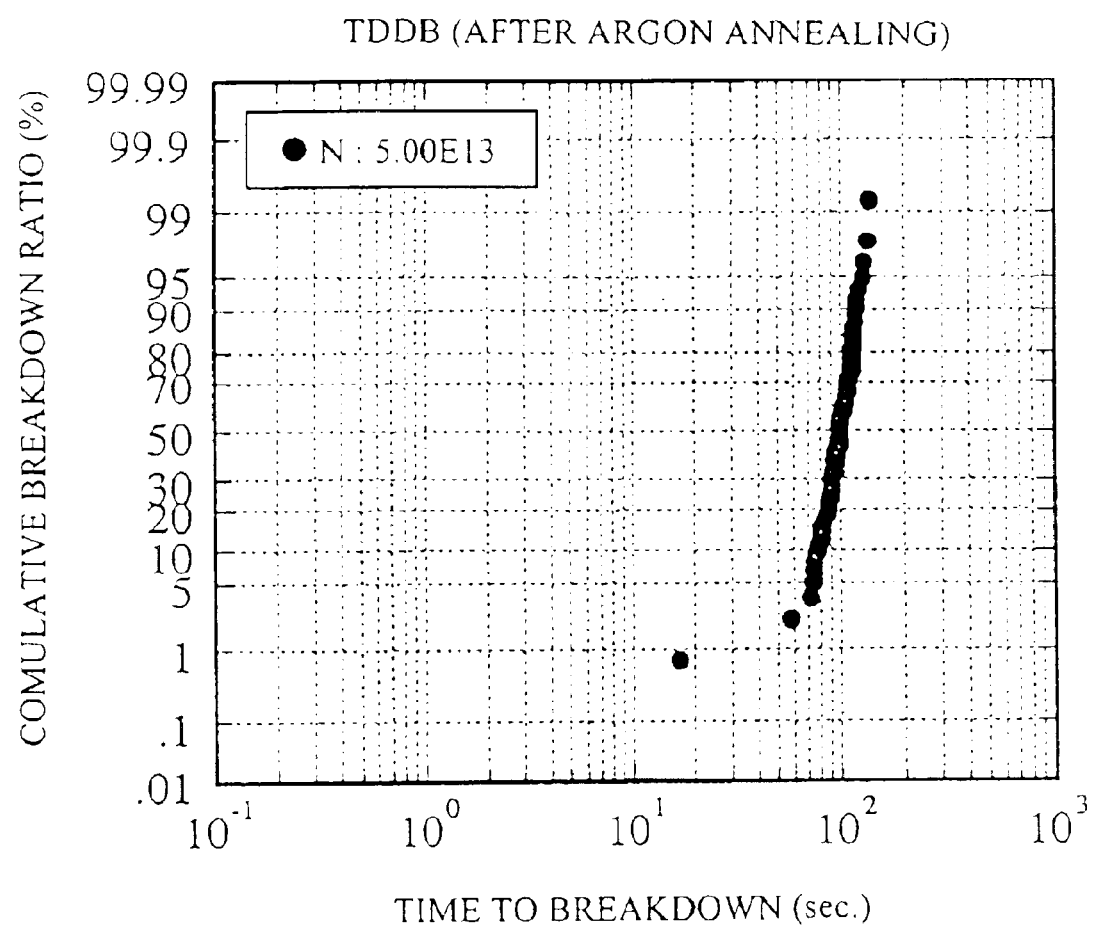
Figure 5C:
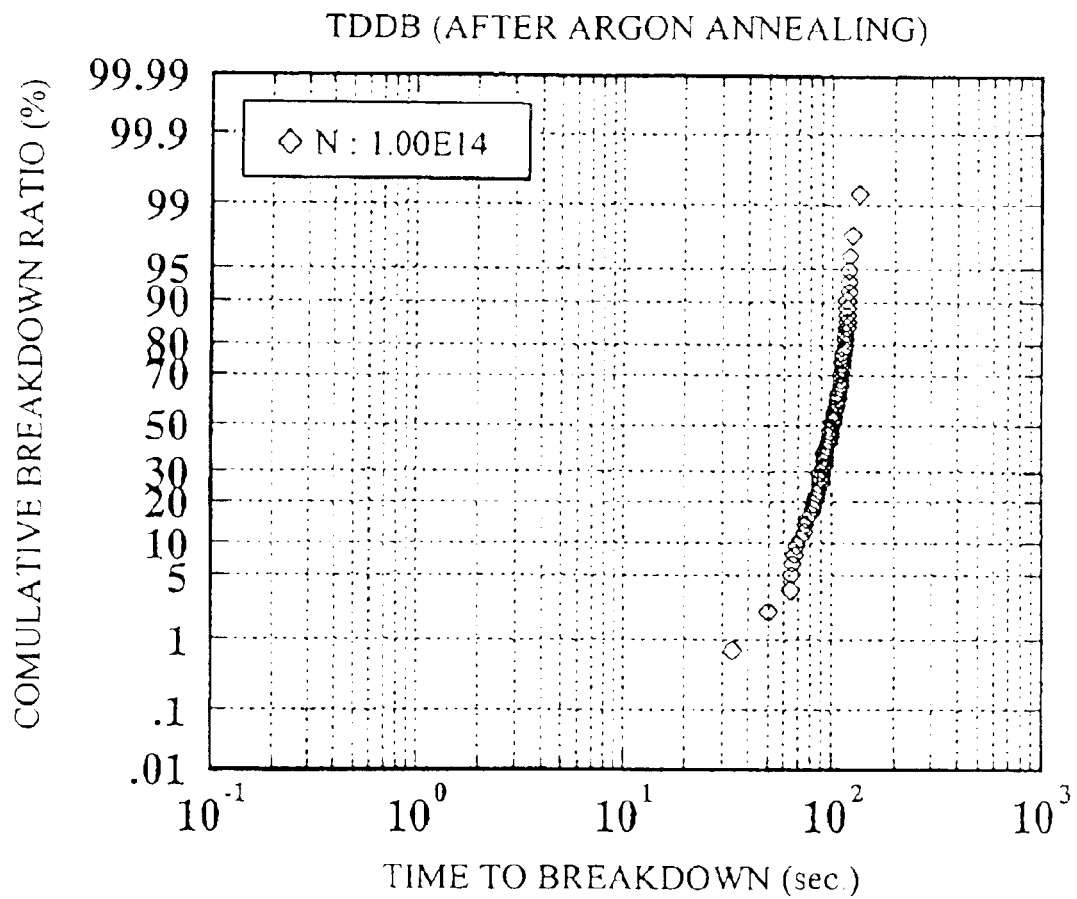
Figure 5D:
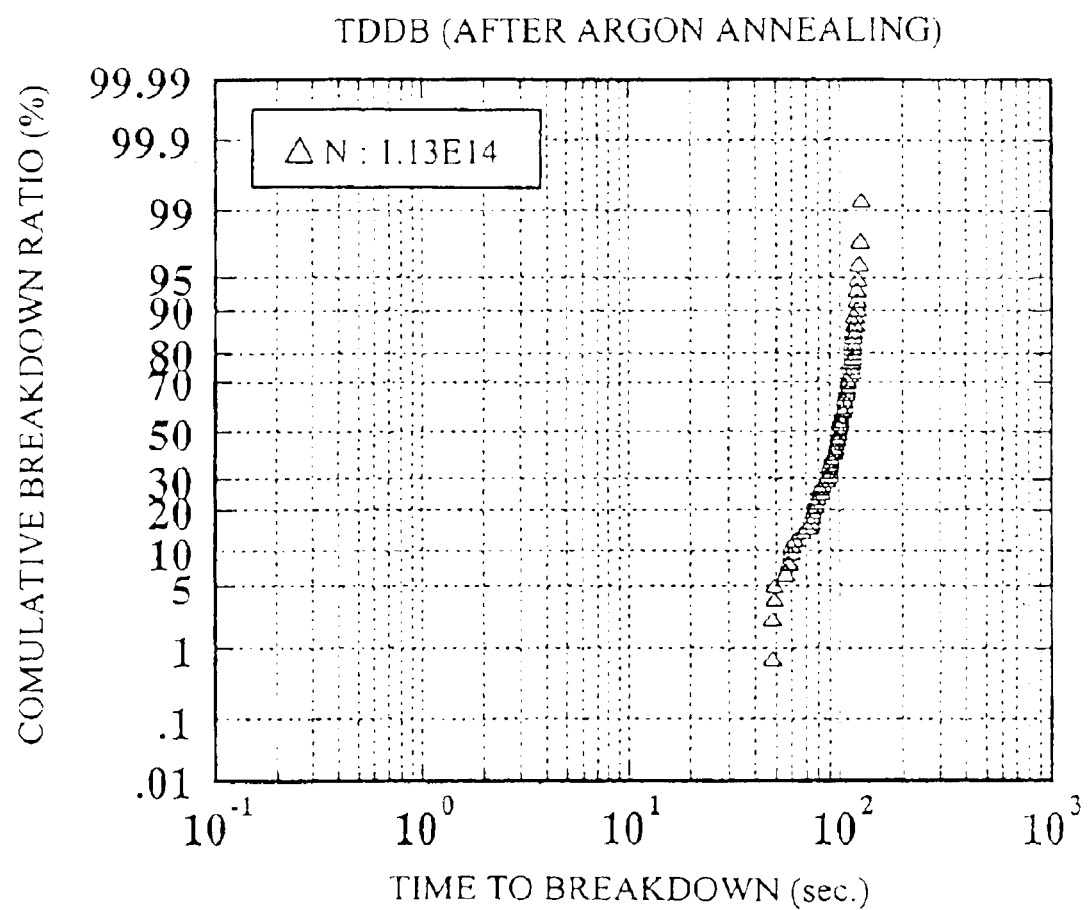
Figure 6A:
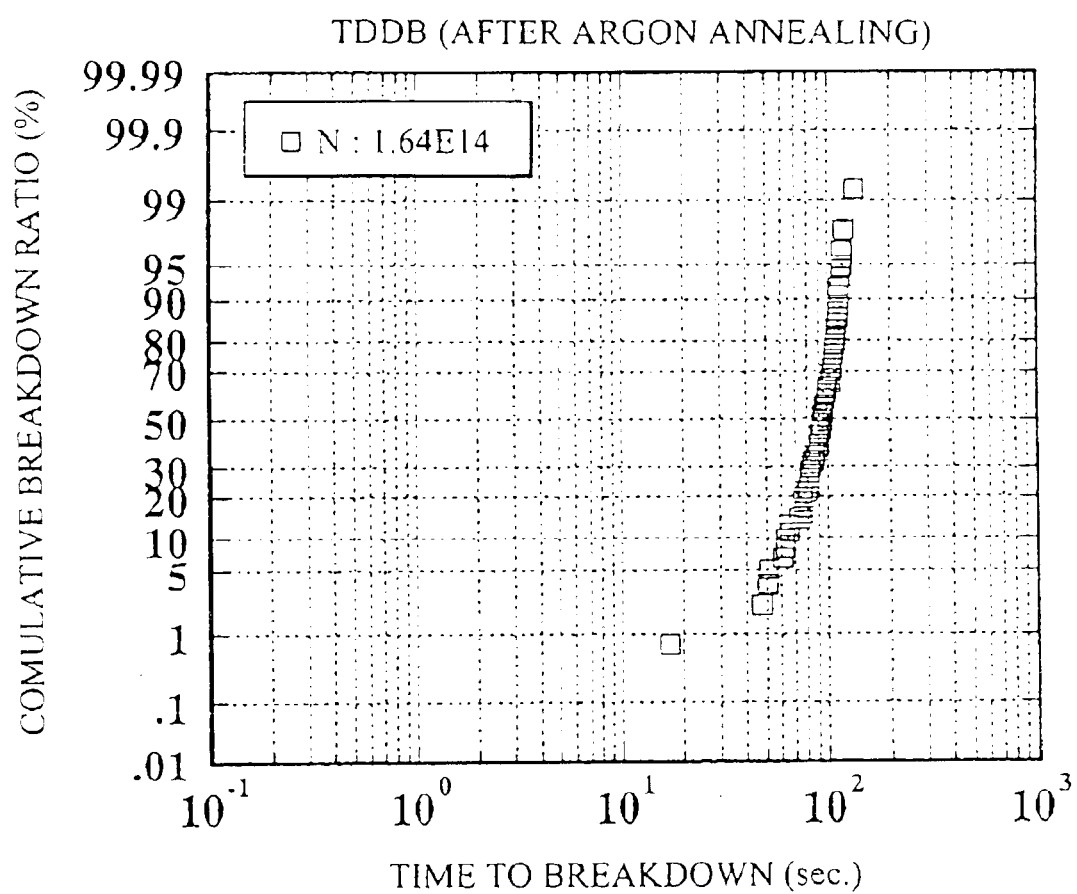
FIGS. 6(A) through 6(D) are views showing the results of a constant-current TDDB test of an argon-annealed nitrogen-doped wafer. In particular.
Figure 6B:
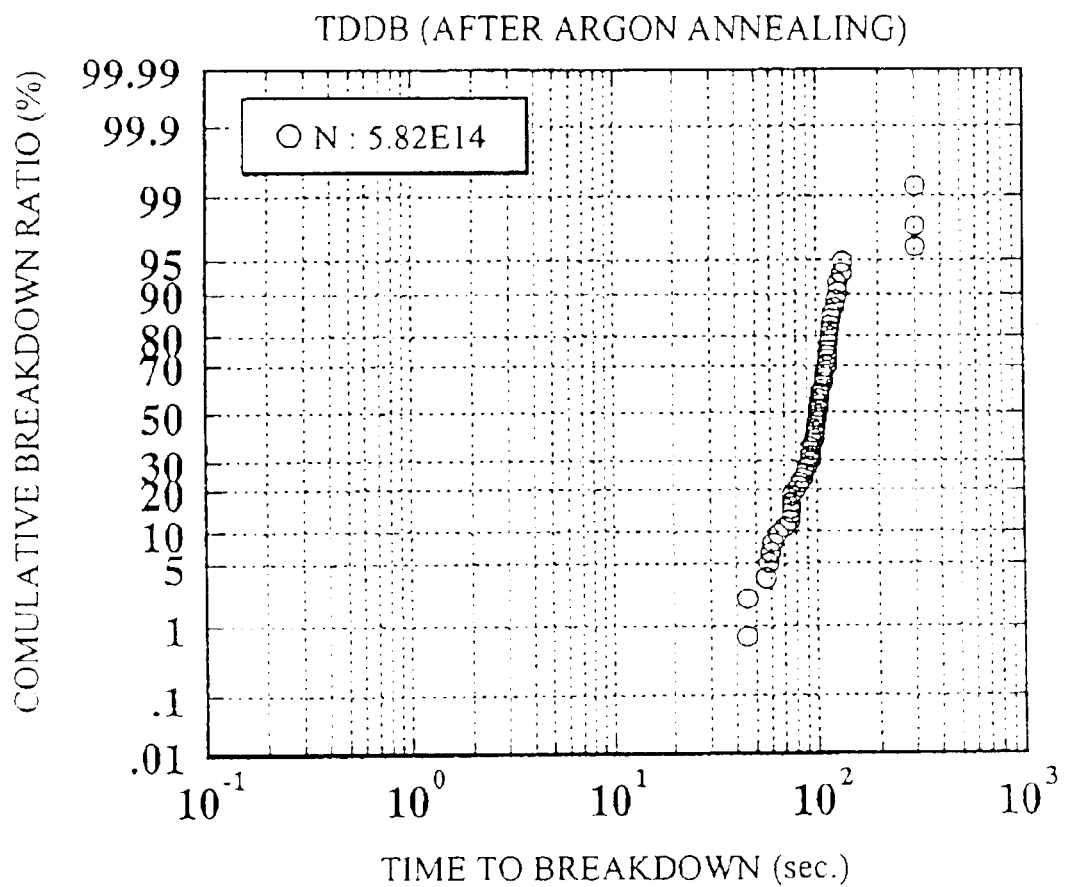
Figure 6C:
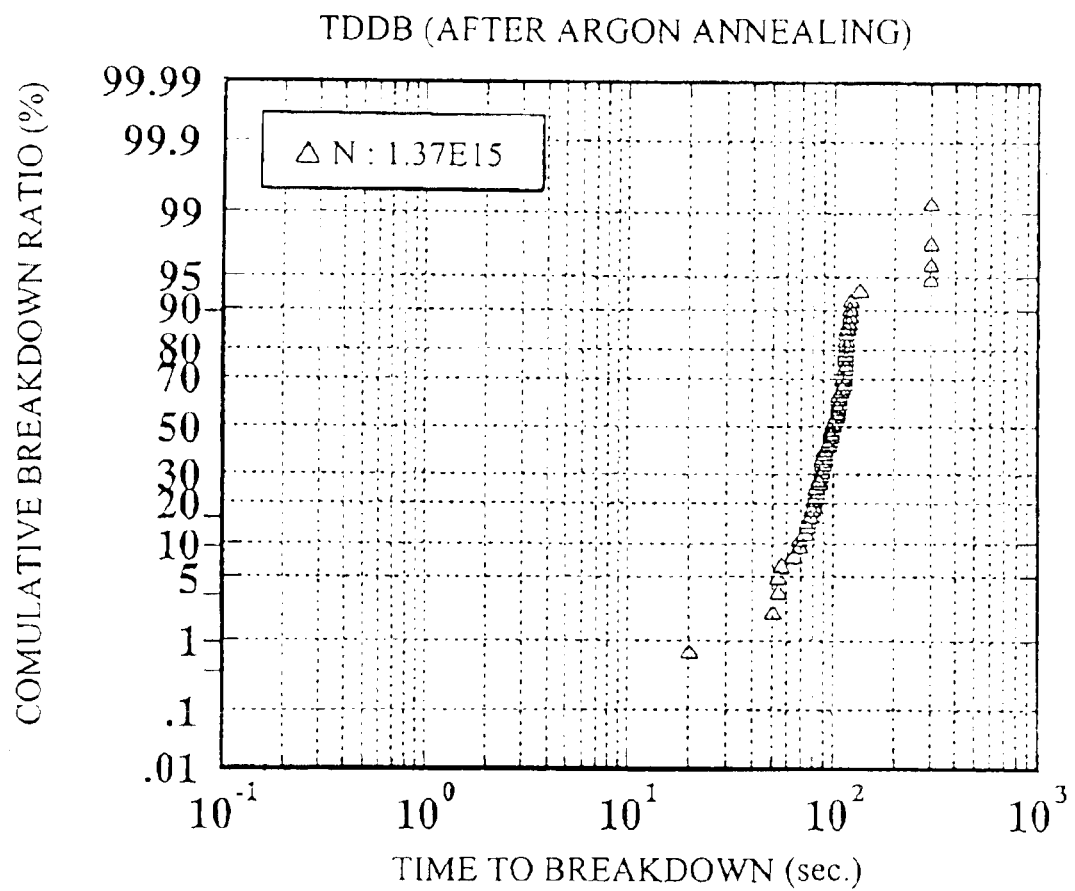

FIG. 5 and FIG. 6 show the results of a constant-current TDDB test when the nitrogen concentration was raised from a condition in which no nitrogen doping at all was performed (FIG. 5(A)) to $5 \times 10^{13}$ atoms/cm$^3$ (FIG. 5(B)), $1 \times 10^{14}$ atoms/cm$^3$ (FIG. 5(C)), $1.13 \times 10^{14}$ atoms/cm$^3$ (FIG. 5(D)), $1.64 \times 10^{14}$ atoms/cm$^3$ (FIG. 6(A)), $5.82 \times 10^{14}$ atoms/cm$^3$ (FIG. 6(B)), and $1.37 \times 10^{15}$ atoms/cm$^3$ (FIG. 6(C)).

As is clear from these Figures, although, up to a nitrogen concentration of $1.64 \times 10^{14}$ atoms/cm$^3$ (FIG. 6(A)), the densely concentrated condition of the points on the graph is unchanged, when the nitrogen concentration is $5.82 \times 10^{14}$ atoms/cm$^3$ (FIG. 6(B)) or $1.37 \times 10^{15}$ atoms/cm$^3$ (FIG. 6(C)), the shifting of the points on the graph to locations somewhat to the rear of 100 seconds which is characteristic of abnormal elements appears.

Figure 6D:
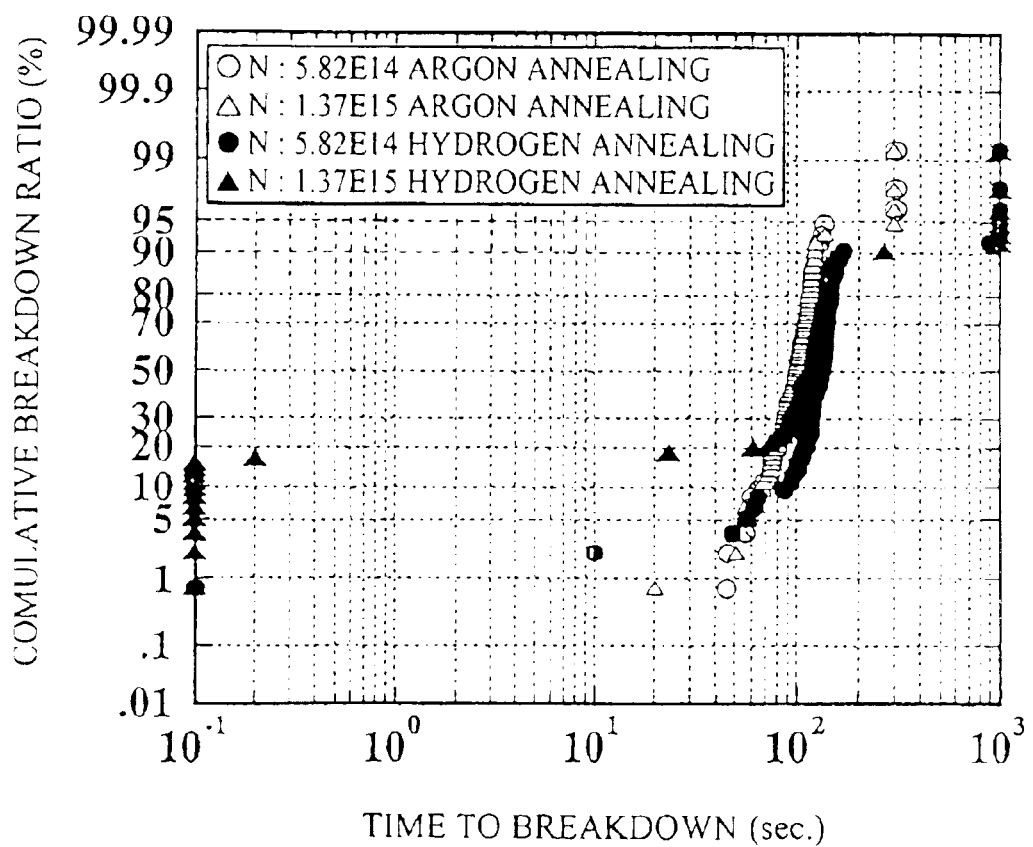
Figure 7:
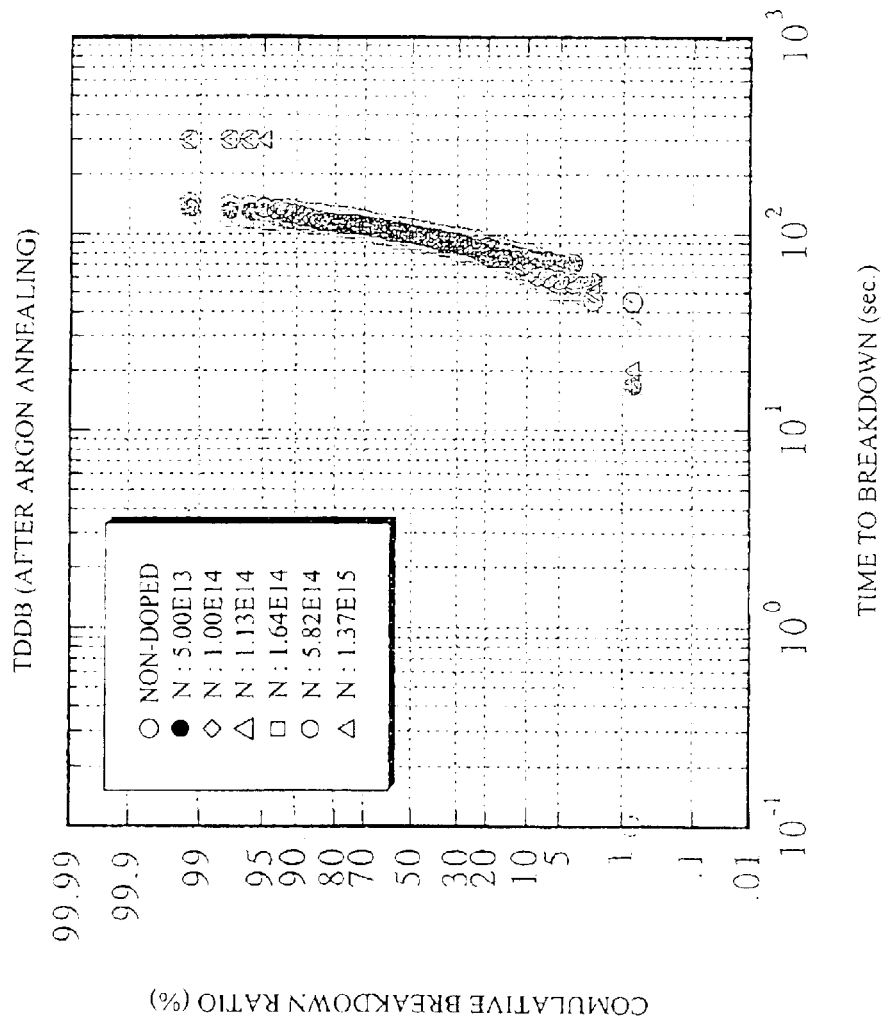
FIG. 7 is a view showing the results of FIG. 5(A) to FIG. 6(C) superimposed.

In FIG. 6(D), the results obtained with wafers doped with nitrogen with a concentration of $5.82 \times 10^{14}$ atoms/cm$^3$ and $1.37 \times 10^{15}$ atoms/cm$^3$ are shown, with the results of hydrogen-annealed wafers and argon-annealed wafers respectively superimposed. Also, in FIG. 7, the results of the wafers of FIG. 5(A) to FIG. 6(C) are shown superimposed.

From these results, it appears that there is an upper limit in the results of performing the constant-current TDDB test on nitrogen-doped argon-annealed wafers between nitrogen concentrations of $1.64 \times 10^{14}$ atoms/cm$^3$ (FIG. 6(A)) and $5.82 \times 10^{14}$ atoms/cm$^3$ (FIG. 6(B)); this is present at a location close to the value of $4 \times 10^{14}$ atoms/cm$^3$ (FIG. 6(D)), which was deemed to be the upper limit from the results of performing the constant-current TDDB test for hydrogen-annealed wafers.

From the above, it can be seen that, although there is a big difference in the results of the TZDB test between hydrogen-annealed and argon-annealed nitrogen-doped wafers, there is scarcely any difference in terms of the results of the constant-current TDDB test.

Thus, from the fact that, for silicon wafers for semiconductor devices (silicon wafers for manufacturing semiconductor devices), the results of the TDDB test must be seriously taken into account, it can be seen that nitrogen-doped wafers for non-oxidative heat treatment that are to be the subject of hydrogen annealing or argon annealing must in each case contain nitrogen with a concentration of $4 \times 10^{14}$ atoms/cm$^3$ or less, which is considered to be the upper limit from the results of a constant-current TDDB test.

Figure 8:
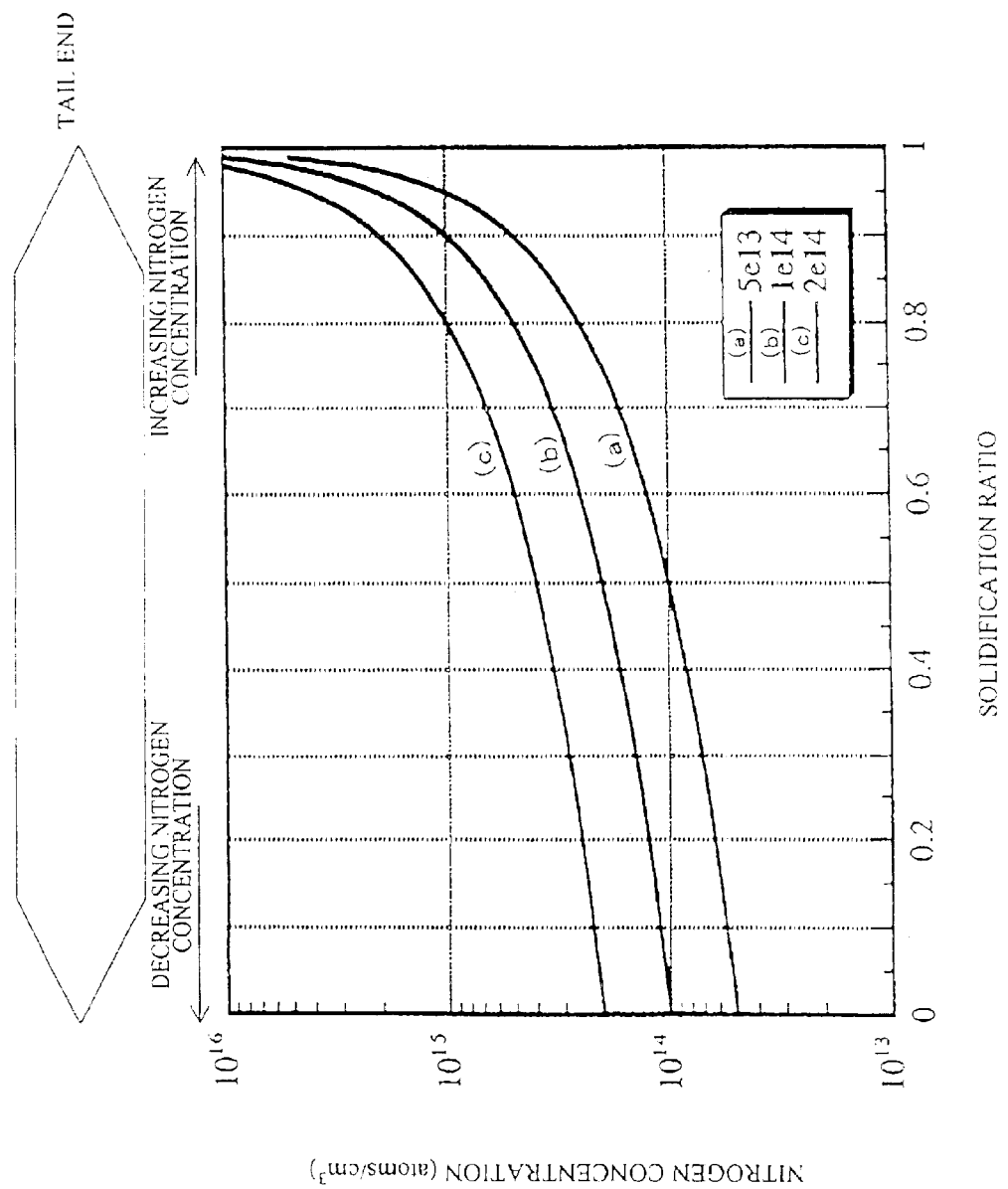
FIG. 8 is a view showing changes in nitrogen concentration in a single crystal pulled using the CZ method.

FIG. 8 is a view showing the change of nitrogen concentration in a pulled single crystal when pulled by the CZ method. In this FIG. 8, the horizontal axis shows the solidification ratio, taking the total amount of polysilicon raw material, which is the raw material of the single crystal ingot, which is introduced as 1, while the vertical axis shows the nitrogen concentration. In this Figure, (a) is the curve when the initial concentration is $2 \times 10^{14}$, and (b) is the curve when the initial concentration is $1 \times 10^{14}$ and (c) is the curve when the initial concentration is $5 \times 10^{13}$.

As is clear from this FIG. 8, due to the nitrogen segregation phenomenon, the nitrogen concentration becomes higher towards the tail end of the pulled silicon ingot (the corresponding silicon ingot shape is shown on the graph).

INDUSTRIAL APPLICABILITY

As described above, according to the present invention, a nitrogen-doped silicon wafer can be provided showing excellent wafer characteristics for a product.

What is claimed is:

1. A heat treated silicon wafer for use in semiconductor device manufacture, wherein the silicon wafer is obtained by slicing a silicon wafer from a silicon ingot being prepared by a Czochralski method or a MCZ method, wherein the sliced silicon wafer has a nitrogen concentration in a range from $5 \times 10^{13}$ atoms/cm$^3$ to $1 \times 10^{15}$ atoms/cm$^3$ and includes void defects; and wherein the heat-treated silicon wafer is prepared by heat-treating the sliced silicon wafer under a non-oxidative atmosphere such that the void defects of a wafer surface layer thereof are reduced.

2. A silicon wafer for non-oxidative heat treatment for use in semiconductor device manufacture, wherein the silicon wafer is obtained from a silicon ingot being prepared by a Czochralski method or a MCZ method with V/G1 higher than 0.18 mm$^2$/° C. min and not exceeding 0.4 mm$^2$/° C. min where V is a pulling speed and G1 is a temperature gradient in a vicinity of a solid/liquid interface, and wherein the silicon wafer contains nitrogen concentration in a range from $5 \times 10^{13}$ atoms/cm$^3$ to $4 \times 10^{14}$ atoms/cm$^3$.

3. The heat-treated silicon wafer according to claim 1, wherein the silicon wafer is heat-treated under a hydrogen atmosphere, an argon atmosphere, or a combination thereof.

4. A method of manufacturing a silicon ingot for manufacturing silicon wafers for non-oxidative heat treatment, the method comprising: pulling a silicon single crystal by a Czochralski method or a MCZ method to manufacture the silicon ingot, wherein nitrogen is doped and the silicon single crystal is pulled under conditions that a portion of the silicon single crystal is formed in which nitrogen concentration is from $5\times10^{13}$ atoms/cm$^3$ to $1\times10^{15}$ atoms/cm$^3$ and that V/G1 is higher than 0.18 mm$^2$/° C. min and not exceeding 0.4 mm$^2$/° C. min where V is a pulling speed and G1 is a temperature gradient in a vicinity of a solid/liquid interface.

5. The silicon wafer according to claim 2, wherein the silicon wafer is for heat treatment under a hydrogen atmosphere, an argon atmosphere, or a combination thereof.

6. A silicon wafer for semiconductor device manufacture, having 3 μm of a surface layer removed wherein a doping amount of nitrogen thereof is determined such that an annealed silicon wafer achieves a predetermined oxide film withstand-voltage non-defective ration with TZDB test after said removal of a surface layer of 3 μm.

7. A method of determination of a doping nitrogen-concentration of a silicon wafer for semiconductor device manufacture comprising:

heat-treating a silicon wafer doped with nitrogen under non-oxidative atmosphere such that void defects of a surface layer are reduced so as to obtain the nitrogen-doped silicon wafer;

removing the surface layer from the nitrogen-doped silicon wafer; and conducting a TDDB or a TZDB test for the nitrogen-doped silicon wafer.

8. The method according to claim 7, wherein the TDDB test determines an upper limit of the nitrogen concentration.

9. The heat-treated silicon wafer according to claim 1, wherein the nitrogen concentration is in a range from $5\times10^{13}$ atoms/cm$^3$ to $4\times10^{14}$ atoms/cm$^3$.

10. The heat-treated silicon wafer according to claim 1, wherein the nitrogen concentration is in a range from $1\times10^{14}$ atoms/cm$^3$ to $4\times10^{14}$ atoms/cm$^3$.

11. The heat-treated silicon wafer according to claim 1, wherein the silicon ingot is prepare by a Czochralski method or a MCZ method with V/G1 higher than 0.18 mm$^2$/° C. min and not exceeding 0.4 mm$^2$/° C. min where V is a pulling speed and G1 is a temperature gradient in a vicinity of a solid/liquid interface.

12. The heat-treated silicon wafer according to claim 9, wherein the silicon ingot is prepared by a Czochralski method or a MCZ method with V/G1 higher than 0.18 mm$^2$/° C. min and not exceeding 0.4 mm$^2$/° C. min where V is a pulling speed and G1 is a temperature gradient in a vicinity of a solid/liquid interface.

13. The heat-treated silicon wafer according to claim 10, wherein the silicon ingot is prepared by a Czochralski method or a MCZ method with V/G1 higher than 0.18 mm$^2$/° C. min and not exceeding 0.4 mm$^2$/° C. min where V is a pulling speed and G1 is a temperature gradient in a vicinity of a solid/liquid interface.

14. The heat-treated silicon wafer according to claim 1, wherein the heat treatment is under a hydrogen atmosphere, an argon atmosphere, or a combination thereof.

* * * * *